(12) United States Patent
Son (10) Patent No.: US 9,197,208 B2
(45) Date of Patent: Nov. 24, 2015

(54) PROJECTED CAPACITIVE TOUCH SENSOR WITH ASYMMETRIC BRIDGE PATTERN

(75) Inventor: Kyu-Tak Son, Mountain View, CA (US)

(73) Assignee: Elo Touch Solutions, Inc., Menlo Park, CA (US)

( * ) Notice: Subject to any disclaimer, the term of this patent is extended or adjusted under 35 U.S.C. 154(b) by 621 days.

(21) Appl. No.: 13/451,253

(22) Filed: Apr. 19, 2012

(65) Prior Publication Data
US 2013/0277193 A1    Oct. 24, 2013

(51) Int. Cl.
*G06F 3/044* (2006.01)
*H03K 17/96* (2006.01)

(52) U.S. Cl.
CPC ............ *H03K 17/9622* (2013.01); *G06F 3/044* (2013.01)

(58) Field of Classification Search
CPC ....... G06F 3/048; G06F 3/044; G06F 3/0354; G06F 3/03547; G06F 3/045; G06F 2203/04112; G06F 2203/04103; H03K 17/962
USPC ........... 200/600; 324/658–690; 345/173–178; 29/842; 178/18.01–18.06, 20.01–20.04
See application file for complete search history.

(56) References Cited

U.S. PATENT DOCUMENTS

| | | | |
|---|---|---|---|
| 4,550,221 | A | 10/1985 | Mabusth |
| 4,639,720 | A | 1/1987 | Rympalski et al. |
| 5,543,590 | A | 8/1996 | Gillespie et al. |
| 5,844,506 | A | 12/1998 | Binstead |
| 7,463,246 | B2 | 12/2008 | Mackey |
| 8,593,410 | B2 * | 11/2013 | Hong et al. ................... 345/173 |
| 2008/0297174 | A1 | 12/2008 | Narasimhan et al. |
| 2009/0160682 | A1 | 6/2009 | Bolender et al. |
| 2009/0194344 | A1 | 8/2009 | Harley et al. |
| 2009/0314105 | A1 | 12/2009 | Dattalo et al. |
| 2009/0322704 | A1 | 12/2009 | Anno |
| 2010/0123674 | A1 | 5/2010 | Wu et al. |
| 2010/0156810 | A1 | 6/2010 | Barbier et al. |
| 2010/0164900 | A1 | 7/2010 | Lin |
| 2010/0207891 | A1 * | 8/2010 | Wang ............................ 345/173 |

(Continued)

FOREIGN PATENT DOCUMENTS

| TW | 201101158 A | 1/2011 |
|---|---|---|
| TW | 201120718 A | 6/2011 |
| TW | 201310312 A | 3/2013 |

OTHER PUBLICATIONS

International Search Report and Written Opinion for Application No. PCT/US2013/036868 dated Jul. 3, 2013.

(Continued)

*Primary Examiner* — Son Le
(74) *Attorney, Agent, or Firm* — Sterne, Kessler, Goldstein & Fox PLLC (57) ABSTRACT

A capacitive touch sensitive device includes a matrix of pads patterned in a first electrically conductive material on a substrate. Horizontally adjacent pads within each even row of the matrix are electrically coupled to one another via channels to form a plurality of horizontally arranged electrodes. Insulators are positioned over respective channels. Conductive links are formed over respective insulators and are configured to electrically couple vertically adjacent pads between odd rows of the matrix to form a plurality of vertically arranged electrodes. The dimensions of the channels and the conductive links are configured such that an RC time-constant (RCtc) of each of the vertically arranged electrodes substantially matches an RCtc of each of the horizontally arranged electrodes.

14 Claims, 4 Drawing Sheets

(56) References Cited

U.S. PATENT DOCUMENTS

| | | |
|---|---|---|
| 2010/0302201 A1 | 12/2010 | Ritter et al. |
| 2010/0321328 A1* | 12/2010 | Chang et al. .................. 345/174 |
| 2011/0007020 A1 | 1/2011 | Hong et al. |
| 2011/0139516 A1* | 6/2011 | Nirmal et al. ............. 178/18.01 |
| 2012/0013564 A1 | 1/2012 | Westhues et al. |
| 2012/0044197 A1 | 2/2012 | Polishchuk et al. |
| 2012/0044198 A1 | 2/2012 | Chai et al. |
| 2013/0321341 A1* | 12/2013 | Takahama .................... 345/174 |

OTHER PUBLICATIONS

Office Action directed to related Taiwanese Patent Application No. 10420110092001, mailed Aug. 19, 2015, with English-language translation; 9 pages.

English-language abstract of Taiwanese Patent Application Publication No. 201101158 A; 2 pages.

English-language abstract of Taiwanese Patent Application Publication No. 201120718 A; 1 page.

English-language abstract of Taiwanese Patent Application Publication No. 201310312 A; 1 page.

\* cited by examiner

PROJECTED CAPACITIVE TOUCH SENSOR WITH ASYMMETRIC BRIDGE PATTERN

BACKGROUND

1. Field

The subject matter disclosed herein relates generally to capacitive touch sensors, and more particularly to a projected capacitive touch sensor with an asymmetric bridge pattern.

2. Description of Related Art

Projected capacitive touch sensors typically include a substrate upon which sensing electrodes are disposed. The substrate may be a durable glass having high optical transparency for viewing images displayed by an underlying display device that displays images such as graphical buttons and icons. When a user touches the outer surface of the substrate at a location corresponding to a desired selection displayed on the display device, the location is determined by sensing a change in the capacitance of the sensing electrodes.

In some projected capacitive touch sensors, the sensing electrodes are arranged in rows and columns. The rows and columns comprise pads that are generally arranged in the form of a matrix. Horizontally adjacent pads in a given row of the matrix are connected together to form a single horizontally arranged electrode. Although, in some projected capacitive touch sensors, the horizontally arranged electrodes may be split so that they do not span the entire sensor. Likewise, vertically adjacent pads in a given column are connected together to form a single vertically arranged electrode, and vertical electrodes like horizontal electrodes optionally may be split.

Typically commercial projected capacitive touch sensor products are constructed from a lamination of at least two layers of glass in which horizontal electrodes and vertical electrodes are on different glass surfaces. For example, horizontal electrodes may be on one surface of a glass layer and the vertical electrodes on the opposite surface of the same glass layer. Alternatively horizontal and vertical electrodes may be fabricated on different glass layers. In either case, there is manufacturing cost associated with lamination of more than one piece of glass and with the fabrication of electrodes on more than one surface. Alternate designs in which both horizontal and vertical electrodes are fabricated on only one glass surface promise reduced manufacturing cost, particularly if the projected capacitive touch sensor includes only one glass layer with no lamination.

To facilitate both horizontally arranged and vertically arranged electrodes on a single surface, bridging connections may be utilized to connect adjacent pads of a given electrode orientation. For example, bridging connections may couple the vertically adjacent pads that form the vertically arranged electrodes. Known bridging connections have a substantially square geometry. That is, the width and height of the bridge connections are the same.

Associated with each electrode is resistance and capacitance, both of which depend on the size of the touch sensor. As the linear dimensions, of the touch sensor increase, so do the resistances and capacitances associated with the electrodes. The resulting resistor-capacitor time constant (RCtc) representative of electronic settling times of the touch sensor tend to grow quadradically with touch sensor size as both resistance and capacitance grow linearly. For small projected capacitive touch sensors used in smart phones or tablet computers, electronic settling times are less of an issue. However, for touch sensors designed for 15" diagonal displays and larger displays, long touch sensor electronic settling times become more problematic.

One problem with such large projected capacitive touch sensors is that the resistor-capacitor time constant (RCtc) of the horizontally and vertically arranged electrodes tends to be high and do not match. For example, a typical RCtc for such a large projected capacitive touch sensor may be 9 μS or higher. This is especially problematic when used in conjunction with fixed drive frequency controllers in which the total scan time is determined by the maximum RCTc of the arranged electrodes. The higher the RCtc, the more time that is needed to sense a capacitance value of the electrode. This in turn impacts the rate at which a touch location can be determined, which may negatively impact user experience.

Electronics may read-out projected capacitive touch sensitive devices in either self-capacitive mode, mutual-capacitive, or a mixed mode, which is combination of the two. In self-capacitive mode, electronics measures one capacitance per electrode. In mutual capacitance mode, or all-points-addressable (APA) mode, electronics measures capacitance between a row electrode and a column electrode. In either case, the capacitance changes when a finger approaches the electrode. The same projected capacitive touch sensor construction may support self-capacitive mode, mutual-capacitive mode and mixed mode electronic read out.

BRIEF DESCRIPTION

In a first aspect, a capacitive touch sensitive device includes a matrix of pads patterned in a first electrically conductive material on a substrate. Horizontally adjacent pads within each even row of the matrix are electrically coupled to one another via channels to form a plurality of horizontally arranged electrodes. Insulators are positioned over respective channels. Conductive links are formed over respective insulators and are configured to electrically couple vertically adjacent pads between odd rows of the matrix to form a plurality of vertically arranged electrodes. The dimensions of the channels and the conductive links are configured such that an RCtc of each of the vertically arranged electrodes substantially matches an RCtc of each of the horizontally arranged electrodes.

In a second aspect, a method of manufacturing a capacitive touch sensitive device includes patterning a matrix of pads in a first electrically conductive material on a substrate. Horizontally adjacent pads within each even row of the matrix are electrically coupled to one another via channels to form a plurality of horizontally arranged electrodes. The method also includes forming insulators over respective channels from an insulator and forming conductive links over respective insulators configured to electrically couple vertically adjacent pads between odd rows of the matrix to form a plurality of vertically arranged electrodes. The dimensions of the channels and the conductive links are configured such that an RCtc of each of the vertically arranged electrodes substantially matches an RCtc of each of the horizontally arranged electrodes.

In a third aspect, a capacitive touch sensitive device includes a matrix of pads patterned in a first electrically conductive material on a substrate. Horizontally adjacent pads within each even row of the matrix are electrically coupled to one another via channels to form a plurality of horizontally arranged electrodes. Insulators are positioned over respective channels. Conductive links are formed over respective insulators and are configured to electrically couple vertically adjacent pads between odd rows of the matrix to form a plurality of vertically arranged electrodes. The dimensions of the channels and the conductive links are configured such that an RCtc of each of the vertically arranged electrodes substantially matches an RCtc of each of the horizontally arranged electrodes. The total number of vertically arranged electrodes is different than a total number of horizontally arranged electrodes, and the RCtc of each of the vertically arranged electrodes and the horizontally arranged electrodes is less than 6.5 µS and is within ±50% of each other.

BRIEF DESCRIPTION OF THE DRAWINGS

The accompanying drawings are included to provide a further understanding of the claims, are incorporated in, and constitute a part of this specification. The detailed description and illustrated embodiments described serve to explain the principles defined by the claims.

DETAILED DESCRIPTION

The embodiments described below overcome the problems discussed above by utilizing connections with asymmetric elements to couple the pads of the horizontally and vertically arranged electrodes.

Figure 1:
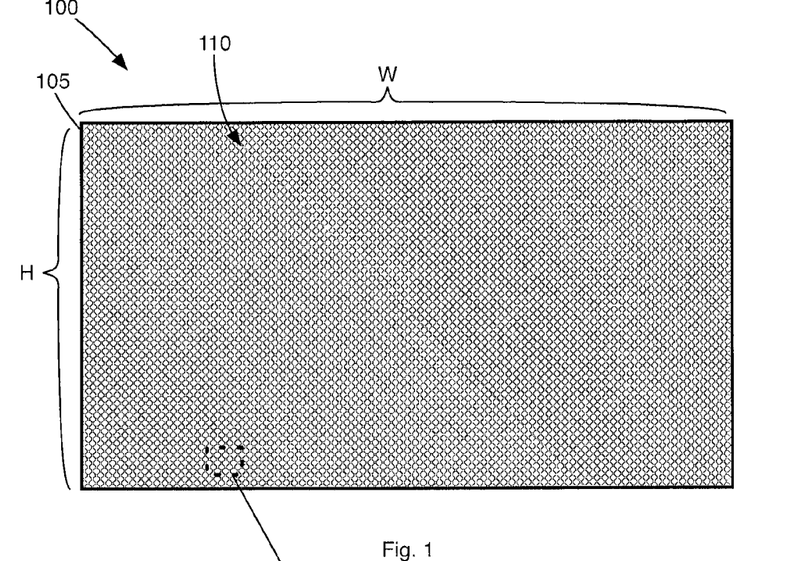
FIG. 1 illustrates a capacitive touch sensitive device.

FIG. 1 illustrates capacitive touch sensitive device 100. The device 100 includes a substrate 105 upon which a electrode matrix 110 is arranged. The electrode matrix 110 includes a group of horizontally arranged electrodes and vertically arranged electrodes. In one exemplary embodiment, to accommodate a 16:9 display aspect ratio, the horizontally and vertically arranged electrodes fit within a rectangular area of the substrate that has a width, W, of about 477 mm and a height, H, of about 270 mm. Sixty-four vertically arranged electrodes and thirty-six horizontally arranged electrodes may be positioned within that area. In other words, the ratio of the number of vertically arranged electrodes to horizontally arranged electrodes may be about a 16:9. It is understood, however, that the principles disclosed herein may be adapted to accommodate different display sizes and a different number of horizontally and vertically arranged electrodes.

Figure 2:
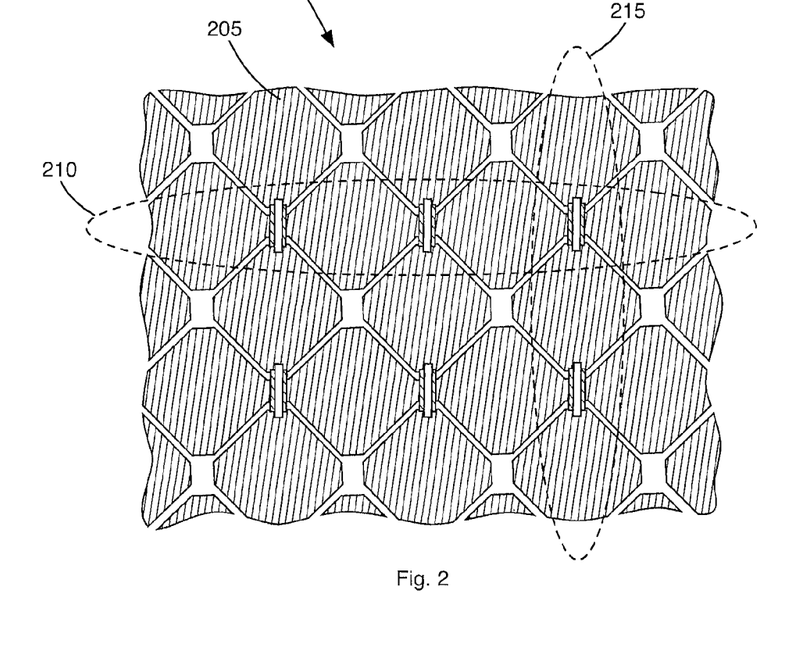
FIG. 2 illustrates details of a portion of an electrode matrix of the capacitive touch sensitive device.

FIG. 2 illustrates details of a portion of the electrode matrix 110. The matrix 110 is generally composed of a group of pads 205 arranged in rows and columns. In one exemplary embodiment, each pad 205 has a generally diamond shape and has an area of about 18 mm². The pads 205 may be patterned by etching an electrically conductive material layer previously deposited on a surface of the substrate 105, such as indium-tin-oxide (ITO). The sheet resistance of the electrically conductive material layer may be about 150 Ω/sq. However, different conductive materials may be used, and the pads 205 may be patterned differently and/or have a different shape.

In one implementation, horizontally adjacent pads 205 within every other row 210 (e.g., even rows) of the matrix 110 are electrically coupled to one another to collectively form horizontally arranged electrodes 210 that span substantially the entire width, W, of the capacitive touch sensitive device 100. In other implementations, a given row may include multiple horizontally arranged electrodes that each group a subset of the pads in the row, for example a horizontal row may be split into left and right electrodes. Pads 205 in the other rows (e.g., odd rows) are coupled to one another column-wise to collectively form vertically arranged electrodes 215 that span substantially the entire height, H, of the capacitive touch sensitive device 100. The horizontally arranged electrodes 210 are utilized to determine the vertical coordinate of a touch. The vertically arranged electrodes 215 are utilized to determine the horizontal coordinate of the touch.

Figure 3A:
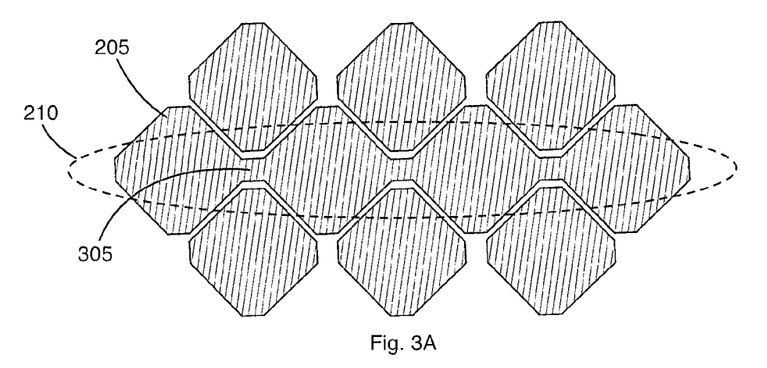
FIGS. 3A-3C illustrate different elements of the electrode matrix that facilitate coupling of pads of the matrix to form horizontally and vertically arranged electrodes.
Figure 3B:
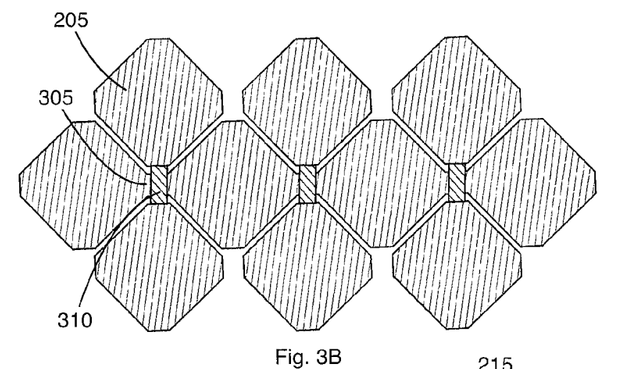
Figure 3C:
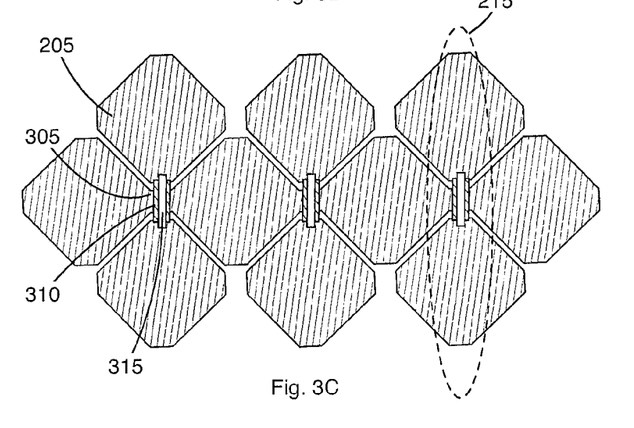

FIGS. 3A-3C illustrate different elements of the matrix 100 that facilitate coupling of the pads 205 to form the horizontally and vertically arranged electrodes (210, 215). Referring to FIG. 3A, channels 305 couple the horizontally adjacent pads 205 of the horizontally arranged electrode 210. The channels 305 may be formed from the same electrically conductive material layer used to form the pads 205 and may be patterned at the same time as the pads 205. For example, an electrically conductive material may be uniformly deposited on the substrate 105. A mask that defines the pattern of FIG. 3A may be used to selectively remove unwanted conductive material to define the pattern of FIG. 3A.

Referring to FIG. 3B, insulators 310 may be formed over the channels 305, and in FIG. 3C, links 315 made of a conductive material may be deposited over the insulators 310 to couple vertically adjacent pads 205 of the vertically arranged electrodes 215. The insulators 310 may be formed from an insulating material such as a polymer or ceramic. For example, glass paste part number NP-7770B1 from Noritake Corp or ceramic part number G3-5679 from Okuno Corp. may be utilized for the insulating material.

The insulators are sized to prevent a short circuit between the links 315 and the channels 305 below, even when there are reasonable registration tolerances or errors during manufacture. That is, the insulators 310 may be slightly larger than the portion of the channels 305 over which the links 315 are deposited. The links 315 may be formed from the same transparent conductive material used to form the pads 205 or a different material. In one exemplary embodiment, the links 315 are formed from a conductive material with a sheet resistance of about 200 Ω/sq.

Figure 4A:
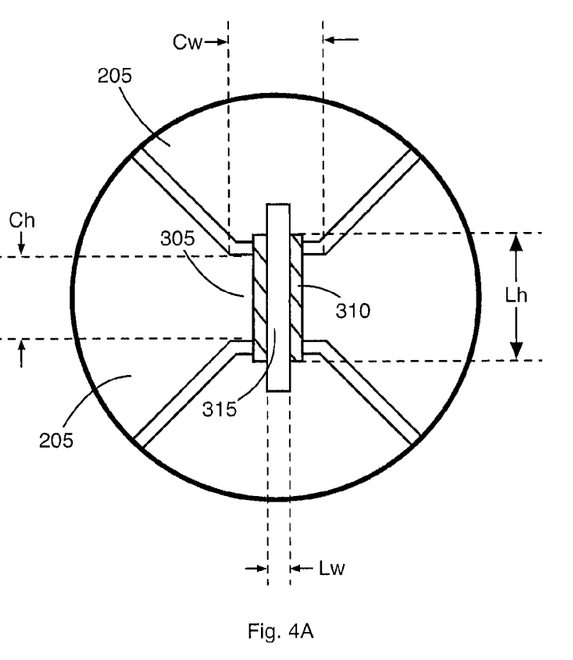
FIG. 4A illustrates various dimensions of channels and links that couple adjacent pads that may be adjusted according to various embodiments.

FIG. 4A illustrates various dimensions (Cw, Ch, Lw, and Lh) of the channel 305 and link 315 that may be adjusted according to various embodiments. Typical channels and links are patterned to overlap and have a generally square geometry with matching surface area sizes. That is, dimension Lw and Ch may match, and dimensions Lh and Cw may match. Applicant has observed that the RCtc associated with the horizontally and vertically arranged electrodes can be varied somewhat by adjusting the sizes of the channels and links.

Table 1 summarizes the results of various RCtc simulation results associated with electrode sensor matrices with different channel and link dimensions. In conventional designs, each of the electrode sensor matrices utilizes a diamond-shape pad with a surface area of about 18 mm². Sixty-four pads are arranged within each horizontally arranged electrode, and thirty-six pads are arranged within each vertically arranged electrode. The RCtc associated with the horizontally arranged electrode is larger than the RCtc associated with the vertically arranged electrode due to its increased length and, therefore, represents a worst-case RCtc of the matrix. Only horizontal electrode RCtc values are shown in Table 1. The RCtc of a electrode may be determined from the resistance per pad, R, and number of pads per electrode, n, and effective capacitance per pad, C, of the electrode which, in this case, is the horizontally arranged electrode. The resistance, R, may be determined by dividing the total electrode resistance by the number of pads in the electrode. The effective capacitance, C, corresponds to coupling capacitance between a given pad and its neighboring pads and to ground. The resistor-capacitor time constant associated with an electrode with n pads is given by $RCtc=(nR)\cdot(nC)=n^2RC$.

As shown, the electrode sensor matrix that utilizes channels and links with respective widths and height (Cw, Ch, Lw, and Lh) of about 0.4 mm has the lowest horizontal RCtc, which was determined to be 8.96 μs.

TABLE 1

| | Size (Lw × Ch) (mm) | | | | |
|---|---|---|---|---|---|
| | 1.0 × 1.0 | 0.5 × 0.5 | 0.4 × 0.4 | 0.3 × 0.3 | 0.2 × 0.2 |
| R (Ω) | 540 | 676 | 732 | 810 | 934 |
| C (pF) | 6 | 3.32 | 2.99 | 2.72 | 2.51 |
| Horizontal RCtc (μs) | 13.27 | 9.19 | 8.96 | 9.02 μs | 9.6 μs |

Table 2 summarizes the results when asymmetric shapes are utilized for the channels 305 and links 315 instead of square shapes. For asymmetric shapes, it was observed that the worst case RCtc was not always associated with the longer electrode axis (i.e., horizontally arranged electrode). Therefore, the RCtc of both the horizontally and vertically arranged electrodes were measured for various dimensional combinations of the channels 305 and links 315. As shown, the lowest overall RCtc is associated with a channel with a width, Cw, of 0.4 mm and a height, Ch, of 1.0 mm, and a link with a width, Lw, of 0.2 mm and height, Lh, of 1.2 mm. The worst-case RCtc is 6.04 μs and is associated with the horizontally arranged electrode. The RCtc for the horizontally and vertically arranged electrodes are within ±50% of each other, and preferably ±10%, and more preferably ±2% of each other. That is, the RCtc of the respective sensors essentially match.

mm and height, Lh, of 1.3 mm. The worst-case RCtc is 6.28 μs and is associated with the vertically arranged electrode.

TABLE 3

| | Channel (Cw × Ch) | | | |
|---|---|---|---|---|
| | 0.4 × 0.9 | 0.4 × 0.8 | 0.4 × 1.0 | 0.4 × 1.1 |
| | Link (Lw × Lh) (mm) | | | |
| | 0.2 × 1.1 | 0.2 × 1.0 | 0.2 × 1.2 | 0.2 × 1.3 |
| Horizontal | | | | |
| R (Ω) | 482 | 510 | 479 | 457 |
| C (pF) | 3.11 | 3.03 | 3.21 | 3.26 |
| RCtc (μs) | 6.14 μs | 6.33 μs | 6.30 μs | 6.10 μs |
| Vertical | | | | |
| R (Ω) | 1723 | 1630 | 1515 | 1583 |
| C (pF) | 2.95 | 2.90 | 3.04 | 3.06 |
| RCtc (μs) | 6.59 μs | 6.13 μs | 5.97 μs | 6.28 μs |

Figure 4B:
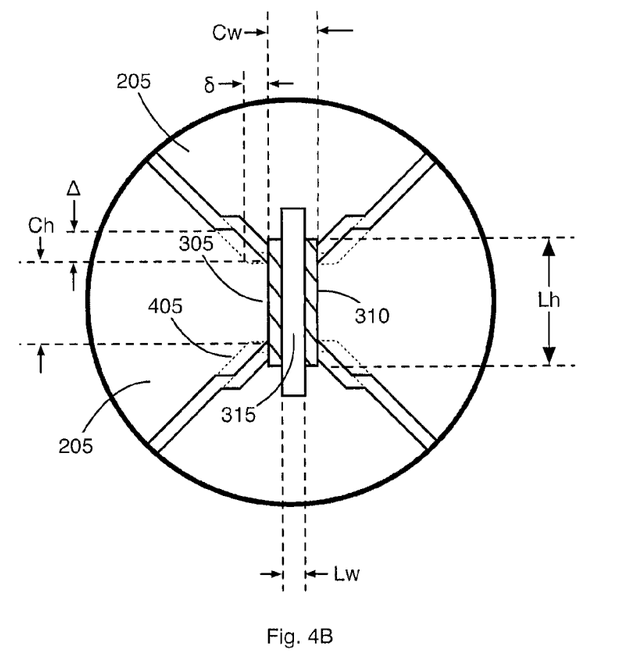
FIG. 4B illustrates an alternative channel geometry that facilities in the reduction of resistance along a horizontally arranged electrode.

FIG. 4B shows an alternate channel geometry that is possible when the link width, Lw, is substantially narrower than the channel width, Cw, as is the case with for the channel of FIG. 4A. The modified channel geometry facilitates the reduction of channel resistance and, therefore, a reduction in the RCtc for the horizontally arranged electrodes, by gradually narrowing the channel height, Ch, of the horizontally arranged electrode as approaches the edge of the insulator 310. The dashed lines 405 in FIG. 4B represents the geometry of the gap between vertical and horizontally arranged electrodes in FIG. 4A and are shown to illustrate the difference between the channel geometries of FIGS. 4A and 4B. The channel geometry of FIG. 4B reduces the current path length for which the channel is most constricted. The channel width Cw for the design of FIG. 4B is smaller than the channel width

TABLE 2

| | Channel (Cw × Ch) | | | | | | | |
|---|---|---|---|---|---|---|---|---|
| | 0.4 × 0.6 | 1.0 × 1.0 | 1.0 × 1.1 | 1.0 × 0.9 | 0.4 × 0.9 | 0.4 × 0.8 | 0.4 × 1.0 | 0.4 × 1.1 |
| Link (Lw × Lh) (mm) | 0.4 × 0.6 | 0.2 × 1.2 | 0.2 × 1.3 | 0.2 × 1.1 | 0.2 × 1.1 | 0.2 × 1.0 | 0.2 × 1.2 | 0.2 × 1.3 |
| Horizontal | | | | | | | | |
| R (Ω) | 732 | 521 | 493 | 553 | 482 | 510 | 459 | 439 |
| C (pF) | 2.99 | 2.99 | 3.17 | 2.91 | 3.11 | 3.03 | 3.21 | 3.26 |
| RCtc (μs) | 8.96 | 6.38 | 6.40 | 6.59 | 6.14 | 6.33 | 6.04 | 5.86 |
| Vertical | | | | | | | | |
| R (Ω) | 732 | 1515 | 1583 | 1447 | 1447 | 1379 | 1515 | 1583 |
| C (pF) | 2.99 | 2.87 | 3.03 | 2.76 | 2.95 | 2.90 | 3.04 | 3.06 |
| RCtc (μs) | 2.94 | 5.63 | 6.21 | 5.18 | 5.53 | 5.18 | 5.97 | 6.28 |

The sheet resistance of the material used to form the channels 305 and links 315 was assumed to be the same for the matrices determined above. For example, the channels 305 and links 315 were assumed to have a sheet resistance of 150 Ω/sq. However, this may not always be practical. In some exemplary embodiments, the materials used to pattern the channels 305 and the links 315 are different. The sheet resistance of the material used to pattern the links 315 may, for example, be 200 Ω/sq.

Table 3 summarizes the results when such a material is used for the links 315. The channels and links of the matrices were arranged as described earlier. The combination with the lowest overall RCtc is represented in the fourth column. In this case, the channel 305 has a width, Cw, of 0.4 mm and height, Ch, of 1.1 mm. The link 315 has a width, Lw, of 0.2

Cw of FIG. 4A by an amount of 2δ where δ is the length of the horizontal kink in the electrode boundaries as shown in FIG. 4B. Representative values of δ are in the range from 100 microns to 400 microns with 200 microns being a typical value. The height of the horizontal electrode at the kink of length δ is greater than the channel height Ch by an amount 2Δ where Δ is the vertical offset of the kink relative to the channel boundaries as shown in FIG. 4B. To receive the full benefit of the shortened channel width Cw, it is desirable that the kink vertical offset Δ is larger than the kink length δ. Representative values of the kink vertical offset Δ are in the range from 300 microns to 1,200 microns with 600 microns being a typical value. Corners in the electrode boundaries can be rounded and smoothed and the design will still provide substantially the same benefits. The essential feature of the design of FIG. 4B is a modified electrode boundary geometry in which the channel width Cw is reduced in a way that reduces the horizontal electrode resistance while to a good engineering approximation retaining a similar area and geometry of the diamond shaped pads that compose the electrodes. This, in turn, reduces the horizontal electrode resistance and hence RCtc while having substantially no effect on vertical electrode resistance of RCtc.

For projected capacitive touch sensor that are read out in self-capacitance mode, the horizontal electrode read out speed (more particularly the excitation drive frequency) is limited by the horizontal RCtc and the vertical electrode read out speed is limited by the vertical RCtc. If the same read out speed is used for both vertical and horizontal electrodes in self-capacitance mode, there is a clear advantage to minimizing the larger or worst-case of the horizontal and vertical RCtc values. For projected capacitive touch screen that are read out in mutual-capacitance mode, the horizontal and vertical RCtc values contribute to a mutual-capacitance settling time that limits the read out speed of mutual capacitances. While the mathematical details of how horizontal and vertical RCtc values combine for mutual capacitance readout is complex, it is still of benefit to balance horizontal and vertical RCtc values to provide faster mutual-capacitance readout.

While the preferred embodiments described above are for projected capacitive touch sensors with horizontal and vertical electrodes on the same surface of the same glass (or polymer) layer, one skilled in the art will understand that balancing of horizontal and vertical values of RCtc also provide benefits for touch sensors with horizontal and vertical electrodes on different glass surfaces.

As described, varying the dimensions of the channels and links allows for the reduction in RCtc and matching of the RCtc associated with the horizontally and vertically arranged electrodes. This in turn facilitates faster acquisition of a touch location, which ultimately results in a more pleasant user experience.

While various embodiments have been described, it will be apparent to those of ordinary skill in the art that many more embodiments and implementations are possible that are within the scope of the claims. The various dimensions described above are merely exemplary and may be adjusted, for example, based upon the dimensions of the substrate, the number pads, the ratio of the number of pads in the different electrode orientations, the sheet material used for the conductive layers, etc. Accordingly, it will be apparent to those of ordinary skill in the art that many more embodiments and implementations are possible that are within the scope of the claims. Therefore, the embodiments described are only provided to aid in understanding the claims and do not limit the scope of the claims.

What is claimed is:

1. A capacitive touch sensitive device, comprising:
   a matrix of pads patterned in a conductive material, the matrix of pads comprising:
      horizontally adjacent pads within each even row of the matrix configured to form horizontally arranged electrodes in the conductive material, and
      vertically adjacent pads between odd rows of the matrix configured to form vertically arranged electrodes in the conductive material;
   channels configured to electrically couple the horizontally adjacent pads;
   insulating material positioned over the channels; and
   conductive links configured to electrically couple the vertically adjacent pads,
   wherein dimensions of the channels and the conductive links are configured as differing dimensional combinations such that an RC time constant (RCtc) of each of the vertically arranged electrodes substantially matches an RCtc of each of the horizontally arranged electrodes and electronic settling times are reduced for faster touch location acquisition.

2. The capacitive touch sensitive device of claim 1, wherein the RCtc of each of the vertically arranged electrodes and the horizontally arranged electrodes is less than 6.5 µS.

3. The capacitive touch sensitive device of claim 1, wherein the RCtc of each of the vertically arranged electrodes is within ±50% of the RCtc of each of the horizontally arranged electrodes.

4. The capacitive touch sensitive device of claim 1, wherein a total number of vertically arranged electrodes is different than a total number of horizontally arranged electrodes.

5. The capacitive touch sensitive device of claim 1, wherein a ratio of a total number of vertically arranged electrodes to a total number of horizontally arranged electrodes is about 16:9.

6. The capacitive touch sensitive device of claim 1, wherein each pad of the matrix comprises:
   a diamond-shape; and
   an area of about 18 mm$^2$.

7. The capacitive touch sensitive device of claim 1, wherein:
   each of the channels comprises:
      a first dimension of about 0.4 mm in a horizontal direction, and
      a second dimension of about 1.0 mm in a vertical direction; and
   each of the conductive links comprises:
      a third dimension of about 0.2 mm in the horizontal direction; and
      a fourth dimension of about 1.2 mm in the vertical direction.

8. The capacitive touch sensitive device of claim 1, wherein the channels are patterned in the conductive material.

9. The capacitive touch sensitive device of claim 1, wherein the conductive material is a transparent conductive material having a sheet resistance of about 150 Ω/sq.

10. The capacitive touch sensitive device of claim 1, wherein the conductive links are formed from a transparent conductive material having a sheet resistance of about 200 Ω/sq.

11. The capacitive touch sensitive device of claim 1, wherein the insulating material comprises insulators positioned between respective channels and conductive links.

12. A capacitive touch sensitive device, comprising:
   a matrix of pads patterned in a conductive material, the matrix of pads comprising:
      horizontally adjacent pads within each even row of the matrix configured to form horizontally arranged electrodes in the conductive material, and
      vertically adjacent pads between odd rows of the matrix configured to form vertically arranged electrodes in the conductive material;
   channels configured to electrically couple the horizontally adjacent pads, each of the channels comprising:
      a first dimension of about 0.4 mm in a horizontal direction, and
      a second dimension of about 1.0 mm in a vertical direction;

insulating material positioned over the channels; and
conductive links configured to electrically couple the vertically adjacent pads, each of the conductive links comprising:
a third dimension of about 0.2 mm in the horizontal direction; and
a fourth dimension of about 1.2 mm in the vertical direction,
wherein the first, second, third, and fourth dimensions are configured such that a resistor-capacitor time constant (RCtc) of each of the vertically arranged electrodes substantially matches an RCtc of each of the horizontally arranged electrodes.

13. The capacitive touch sensitive device of claim 12, wherein a total number of vertically arranged electrodes is different than a total number of horizontally arranged electrodes.

14. The capacitive touch sensitive device of claim 12, wherein the RCtc of each of the vertically arranged electrodes and the horizontally arranged electrodes are less than 6.5 µS and are within ±50% of each other.

\* \* \* \* \*